United States Patent [19]
Haghiri-Tehrani et al.

[11] Patent Number: 5,851,854
[45] Date of Patent: Dec. 22, 1998

[54] METHOD FOR PRODUCING A DATA CARRIER

[75] Inventors: Yahya Haghiri-Tehrani; Albert Ojster, both of Munich; Achim Oertel, Rosenheim, all of Germany

[73] Assignee: Giesecke & Devrient GmbH, Munich, Germany

[21] Appl. No.: 691,376

[22] Filed: Aug. 2, 1996

[30] Foreign Application Priority Data

Aug. 4, 1995 [DE] Germany .................. 195 28 730.4

[51] Int. Cl.[6] .................................................. H01L 21/44
[52] U.S. Cl. .......................................... 438/118; 438/126
[58] Field of Search .................. 437/205, 209; 257/679, 922; 438/118, 126

[56] References Cited

U.S. PATENT DOCUMENTS

| | | | |
|---|---|---|---|
| 4,380,699 | 4/1983 | Monnier et al. | 257/679 |
| 4,450,024 | 5/1984 | Haghirir-Tehrani et al. | 156/108 |
| 4,603,249 | 7/1986 | Hoppe et al. | 257/679 |
| 4,617,216 | 10/1986 | Haghiri-Tehrani et al. | |
| 4,735,996 | 4/1988 | Nagai et al. | 525/326.4 |
| 4,835,460 | 5/1989 | Chapotot | 324/97 |
| 4,843,225 | 6/1989 | Hoope. | |
| 4,931,853 | 6/1990 | Ohuchi et al. | 257/679 |
| 4,966,857 | 10/1990 | Haghiri-Tehrani et al. | 437/209 |
| 5,637,858 | 6/1997 | Hoppe et al. | 257/679 |
| 5,640,306 | 6/1997 | Gaumet et al. | 257/379 |

FOREIGN PATENT DOCUMENTS 2081644  2/1982  United Kingdom.

*Primary Examiner*—Jey Tsai
*Assistant Examiner*—Michael S. Lebentritt
*Attorney, Agent, or Firm*—Bacon & Thomas, PLLC

[57] ABSTRACT

In a multilayer data carrier, an electronic module is provided in a corresponding opening or gap in at least one layer. For filling the remaining cavity after installation of the module in the gap, one provides on a layer adjacent the gap or on the layer containing the gap or directly on the electronic module a material preferably applied by printing technology and having a softening point lower than the softening point of the layer.

14 Claims, 5 Drawing Sheets

METHOD FOR PRODUCING A DATA CARRIER

FIELD OF THE INVENTION

This invention relates to a method for producing a multilayer data carrier with at least one opening in at least one layer for receiving an electronic module.

BACKGROUND OF THE INVENTION

Such methods have been known for some time and are used for producing data carriers, for example chip cards, which are employed today in many areas, e.g. in access control systems or as means of payment. The electronic module located in the data carrier usually includes a carrier with an integrated circuit as well as coupling elements electrically connected with the integrated circuit and used for communication with external devices. The coupling elements are designed either in the form of contact surfaces for contacting communication or as coils for noncontacting communication.

In conventional methods the electronic module is disposed in the opening of a data carrier. The remaining cavity between the electronic module and the opening is left open. This can lead to deformations in the data carrier layers covering the opening which impair the appearance of sensitive elements, for example signature stripes or holograms, applied in this area.

A possible method for achieving plane surfaces of the cover layers is described in DE 32 48 385 A1. An electronic module is disposed in a two-step hole in a layer laminate from a first side. In a second step the cavity remaining between the hole and the electronic module is filled with a filling material, such as silicone rubber, from the second side of the layer laminate. After the filling material is added, a cover layer is laminated on the second side of the layer laminate, resulting in a plane surface even in the area of the filled hole.

DE 30 29 939 C2 likewise describes a method for producing multilayer data carriers. An electronic module is disposed in the hole of a core layer. Then a layer of thermoplastic material and a cover layer are each positioned on this core layer symmetrically from both sides, the layers of thermoplastic material having a lower softening point than the core layer and the cover layers of the data carrier. The sequence of layers is laminated under pressure and heat so that the softening thermoplastic material penetrates into the remaining cavity between the electronic module and the hole and fills it.

It is thus known to fill the remaining cavity of the opening in the area of the module with a filling material and thus achieve data carriers with plane surfaces in the area of the electronic module. However, the necessary measures are comparatively elaborate due to the special method steps or the necessity of using special layers.

SUMMARY OF THE INVENTION

The problem of the present invention is therefore to propose on the basis of the prior art a simple and cost-effective method for producing a multilayer data carrier whose surface has no deformation whatsoever even in the area of the embedded module.

This problem is solved by the characterizing features of claim 1.

The basic idea of the invention is to be seen in that the material used for filling the remaining cavity is preferably applied to at least one of the layers or to the electronic module by printing technology. The particular advantage of the invention is that the filling material is thus already applied to individual layers before actual production of the data carrier. One need therefore neither position additional layers of filling material during actual production by lamination, nor supply the filling material in a separate method step after lamination. Furthermore, the inventive method also makes it possible to supply filling material in certain areas, so that the filling material is available selectively in the area of the opening.

In the inventive method a filling material in the form of e.g. thermoplastic material or wax is applied at least in the area of the opening to at least one layer intended to cover an opening for receiving the electronic module in a further layer. Alternatively, the filling material can also be disposed over the hole in the layer laminate or directly on the electronic module.

The filling material has a softening point lower than that of the data carrier layers. This permits the filling material first to soften and fill at least partly the opening in the area of the electronic module during lamination of the data carrier under heat and pressure. The remaining data carrier layers then soften and interconnect, whereby the layer covering the opening has a plane surface in the area of the opening since the remaining cavity in the area of the electronic module is already filled with the filling material.

The filling material can be applied to the layer by a great variety of methods. For example it can be printed on the layer, or a piece punched out of a foil of filling material can be glued on. It is also conceivable to apply the filling material in the softened state or as lacquer in the form of a drop via a hollow needle.

BRIEF DESCRIPTION OF THE DRAWINGS

Further advantages and features can be taken from the figures, in which.

DETAILED DESCRIPTION

Figure 1:
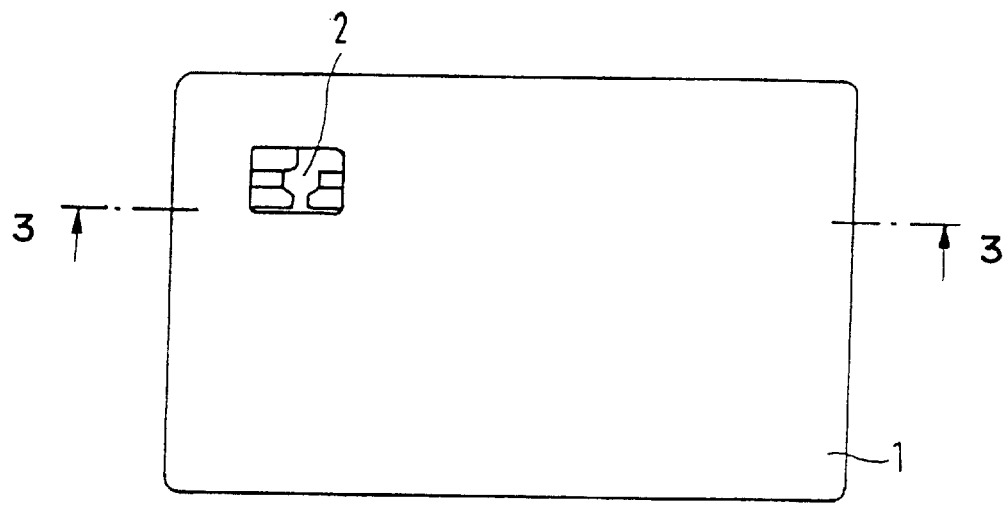
FIG. 1 shows a data carrier with a electronic module for contacting communication produced by the inventive method.

FIG. 1 shows a data carrier which has been produced by the inventive method. It includes body 1 produced from a plurality of layers, an electronic module being disposed in an opening in body 1. The electronic module generally includes an integrated circuit which is electrically connected with an external device via contact surfaces 2 shown in FIG. 1 for contacting communication. Such electronic modules are well known to the expert, being described more closely for example in the abovementioned patents or specifications.

Figure 2:
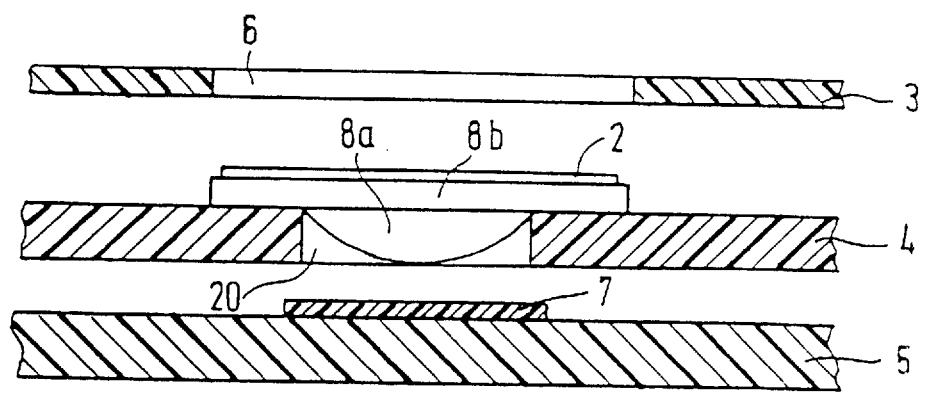
FIG. 2 shows a sectional drawing of the single layers of the data carrier according to FIG. 1 along line A—A before completion.

FIG. 2 shows a sectional drawing of single layers 3, 4 and 5 of the data carrier according to FIG. 1 produced for example from PVC along line 3—3 before completion of the data carrier. Layers 3, 4 and 5, like the layers in the following embodiments, can be supplied in the form of multiplecopy sheets well known to the expert or in the form of long bands which are wound up as rolls. Layers 3 and 4 have openings for receiving the electronic module in the form of holes 6 and 20. Hole 20 of layer 4 contains an electronic module comprising contact surfaces 2 and the chip carrier comprising carrier substrate 8b and casting 8a which surrounds the integrated circuit. The integrated circuit is electrically connected with contact surfaces 2 through the carrier substrate via for example bonding wires.

The electronic module shown here is of course only exemplary and not restricted to the embodiment shown. The module can instead also be manufactured by other techniques well known to the expert, for example the lead frame technique or the TAB technique.

The electronic module is positioned in hole 20, the part of carrier substrate 8b overlapping hole 20 being fixed to layer 4 for example by an adhesive. This may be an adhesive well known to the expert, for example a liquid adhesive or thermoplastic material. Filling material is located on layer 5 in the area of hole 20 in the form of layer 7 of thermoplastic material whose softening point is lower than that of layer 5.

Such layers may be for example of polyethylene or other materials, such as lacquers, etc. Layer 7 of thermoplastic material can be applied e.g. by screen printing or heat transfer printing and overlaps hole 20 in this embodiment. Layer 7 of thermoplastic material can of course also be smaller than, or correspond to, the dimensions of hole 20. Other methods are also possible for applying layer 7 of thermoplastic material to layer 5. Layer 7 can thus also be applied by punching a suitable piece out of a foil of thermoplastic material and gluing it to the layer by an adhesive.

For completing the data carrier, layers 3, 4 and 5 are laminated together under the action of pressure and heat, whereby layer 7 of thermoplastic material softening first penetrates into remaining cavity 20 in the area of the module and thus fills the cavity. Remaining layers 3, 4 and 5 then soften and interconnect under the pressure.

To increase the adhesive effect between the data carrier layers one can pretreat individual layers and/or the electronic module with a plasma before lamination.

Figure 3:
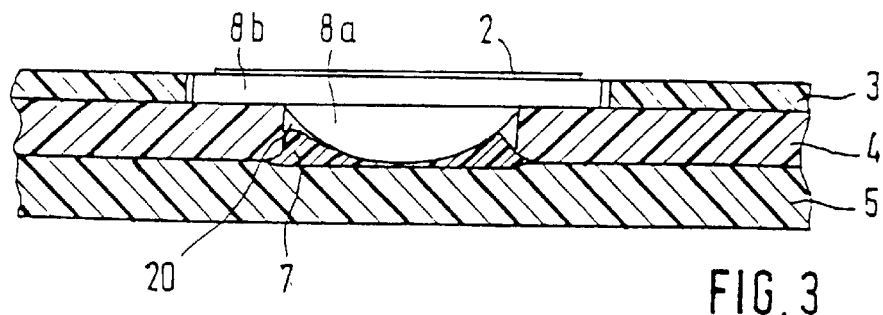
FIG. 3 shows a sectional drawing of the finished data carrier according to FIG. 1 along line 3—3.

FIG. 3 shows the completely laminated data carrier. One can see how thermoplastic material 7 fills the remaining cavity of hole 20.

Figure 4:
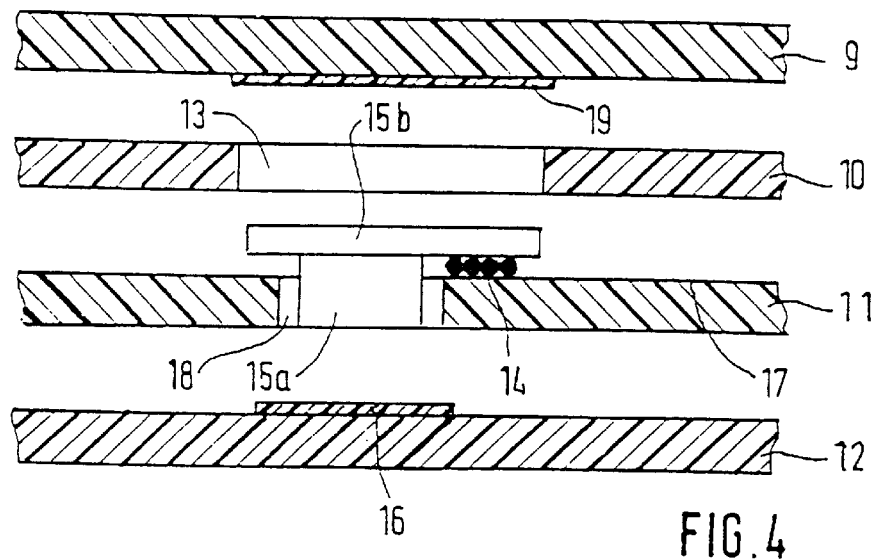
FIG. 4 shows a sectional drawing of the single layers of a second embodiment of a data carrier with an electronic module for noncontacting communication produced by the inventive method.

FIG. 4 shows the sectional view of single layers 9, 10, 11 and 12 of a second embodiment of a data carrier before completion, the data carrier having an electronic module for noncontacting communication. Layers 10 and 11 have openings for receiving the electronic module in the form of holes 13 and 18. The openings can of course also be executed differently and exist for example in the form of blind holes or as multistep holes.

The electronic module is likewise exemplary and shown schematically. It has coil 14 as a coupling element for communication with an external device, and a chip carrier electrically connected with the ends of the coil and comprising carrier substrate 15b and casting 15a in which the integrated circuit is located. The ends of coil 14 are electroconductively connected with conductive paths located on carrier substrate 15b and not shown here. The other ends of the conductive paths not shown here are electrically connected with the integrated circuit located in casting 15a. However, the coil ends can also be connected directly with the connection points of the integrated circuit. Such modules are well known to the expert and will not be explained further here.

Figure 5:
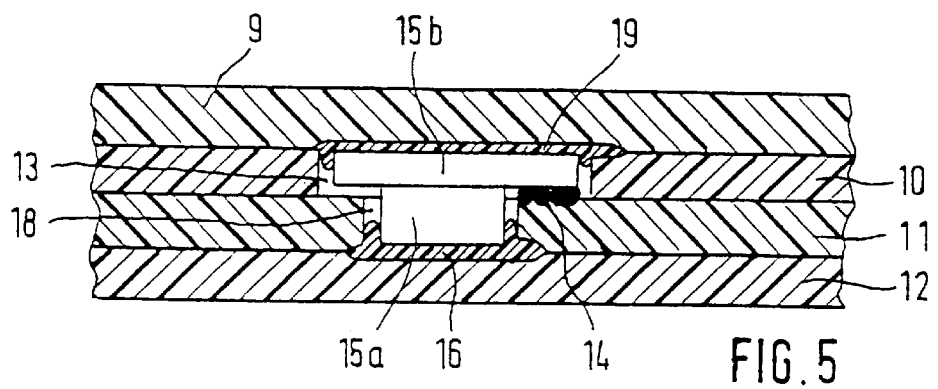
FIG. 5 shows a sectional drawing of the finished data carrier according to FIG. 4.

The shown electronic module is disposed in this example on layer 11. In the area of holes 13 and 18 layers 9 and 12 have filling material in the form of layers of thermoplastic material 16 and 19 with a low softening point, which have been applied to layers 9 and 12 by the method described above. FIG. 5 shows the completely laminated data carrier.

Figure 6:
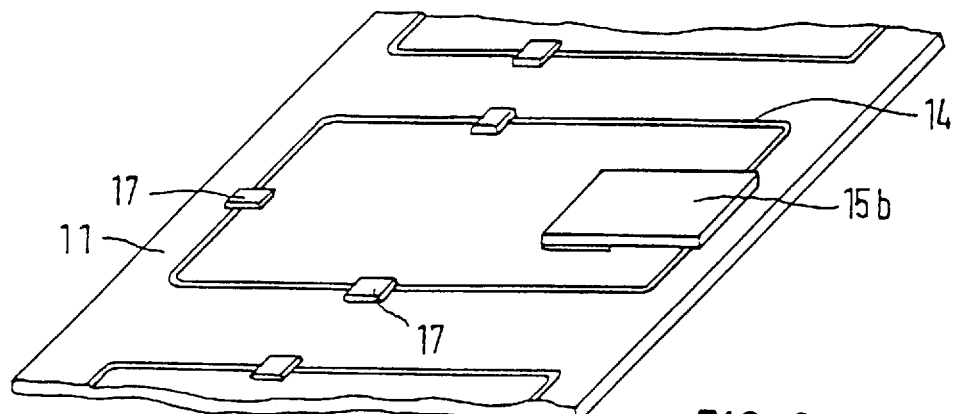
FIG. 6 shows a perspective view of layer 11 from FIG. 4 formed as a semifinished product.

In the data carrier just shown, the electronic module has been disposed on layer 11 directly before lamination of the data carrier. The production of the electronic module and the completion of the data carrier are often performed at different places. It is then desirable to be able to transport the relatively sensitive module safely between the places. In a development of the inventive method, a semifinished product for producing the data carrier according to FIG. 4 is therefore produced in a further method step. For this purpose at least one dot 17 of a material which serves to fix the electronic module, for example thermoplastic material with a low softening point or another adhesive, is applied to layer 11 by one of the abovementioned methods. Coil 14 of the electronic module is fixed on layer 11 via dots 17, as FIG. 6 shows. Fixation can take place for example by applying heated, liquid thermoplastic material to layer 11 and pressing coil 14 into as yet unhardened thermoplastic material 17. It is also conceivable to apply a liquid adhesive and fix the coil thereto. The dots can of course also be applied as thermoplastic material by screen printing or by heat transfer printing. The thermoplastic material must then be heated and thus liquefied before the electronic module is glued on.

This produces a semifinished product which carries the electronic module up to completion of the data carrier, so that the module can be safely transported in a simple way. Transport can be effected in especially advantageous fashion if layer 11 is supplied in the form of an endless sheet on which the electronic modules are disposed. The band can then be folded like an accordion. Additionally layer 10 shown in FIG. 4 can be laminated onto the semifinished product shown in FIG. 6 so that the electronic module is protected from both sides.

Coil 14 of the electronic module can also be fixed to layer 11 by means of ultrasound welding instead of, or in addition to, being fixed by dots 17. The activation of the thermal adhesive at dots 17 for fixing coil 14, which is done manually at present, can thus also be omitted or at least limited. Furthermore, ultrasound welding embeds coil 14 into layer 11, thereby also reducing the material displacement in the later laminating process.

Another semifinished product not shown here for producing a data carrier can also be produced by fixing electronic module 15a, 15b, 14 on layer 9. Additional dots of thermoplastic material or another adhesive are then applied to layer 9 for fixing the electronic module on layer 9. This development has the advantage that the additional dots can be applied together with thermoplastic material 19 which serves as a filling material. In a data carrier finished according to this semifinished product, coil 14 then runs between layers 9 and 10. Electronic module 15a, 15b, 14 used here can therefore advantageously be designed so that coil 14 is disposed on the side of carrier substrate 15b facing away from casting 15a.

Figure 7:
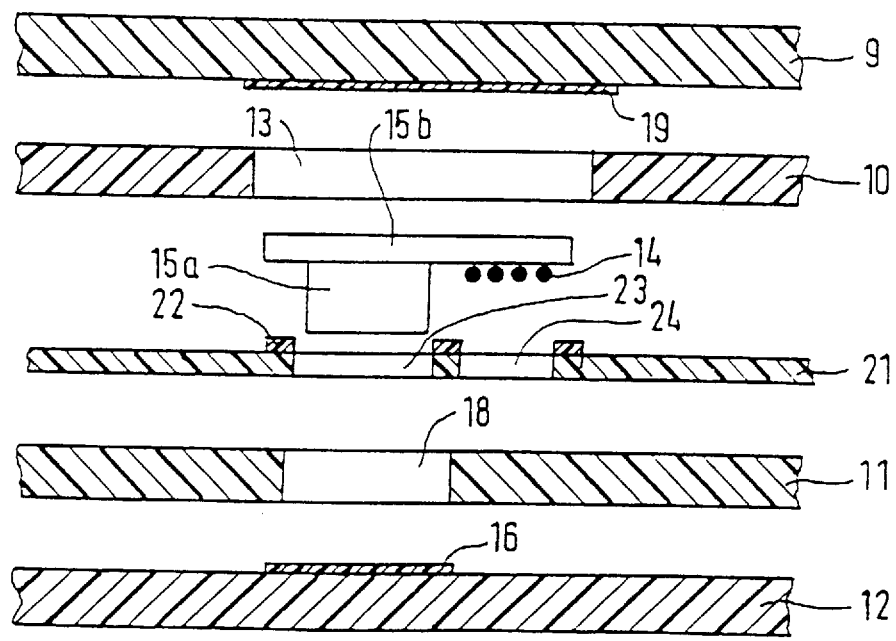
FIG. 7 shows a sectional drawing of the single layers of a developed data carrier according to FIG. 4 with a hole for receiving the coil.

According to a development of the data carrier shown in FIG. 4, one provides in addition to layers 9, 10, 11 and 12 further layer 21 (see FIG. 7) having holes 23 and 24, hole 24 serving to receive coil 14 in the area of carrier substrate 15b. This relieves the electric connections between the coil ends and the conductive paths located on carrier substrate 15b during lamination under pressure and heat. The thickness of layer 21 is advantageously selected to be at least as thick as coil 14. In addition, further layer 21 can have layer 22 of thermoplastic material with a low softening point which surrounds holes 23 and 24. Layer 22 of thermoplastic material is likewise applied by one of the abovementioned methods. During lamination of the data carrier, layer 22 of thermoplastic material softens, thereby likewise filling the remaining cavities in the area of the electronic module.

Figure 8:
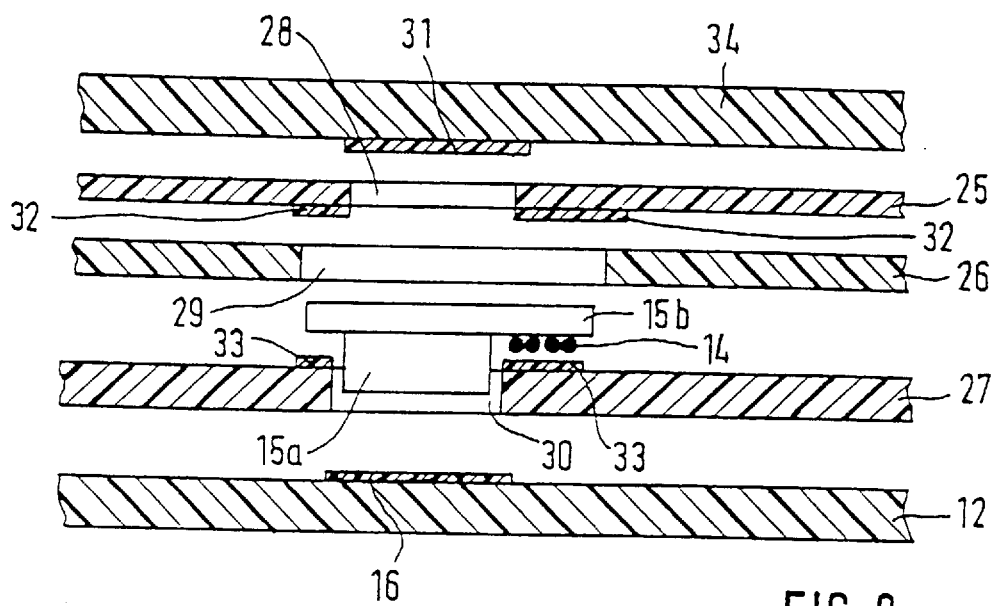
FIG. 8 shows a sectional drawing of a second development of the data carrier according to FIG. 4 with an additional layer for receiving a carrier substrate.
Figure 9:
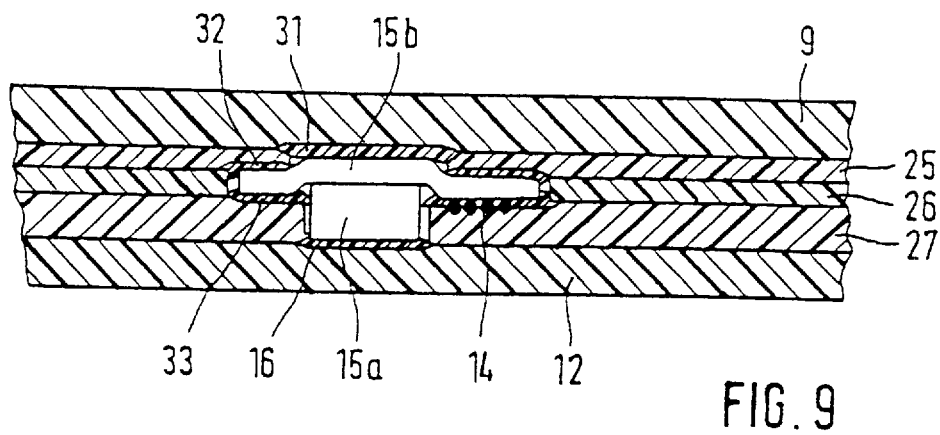
FIG. 9 shows a sectional drawing of the finished data carrier of FIG. 8.

In a further development of the data carrier of FIG. 4 layers 12, 25, 26, 27, 34 with holes 28, 29, 30 are supplied, as FIG. 8 shows. Thermoplastic material 31, 32, 33 and 16 is applied to the layers by the abovementioned method. The thickness of layer 27 is selected to be smaller than the thickness of casting 15a so that carrier substrate 15b deforms during lamination of the layers under pressure in such a way that it is pressed into hole 28 in layer 25. This makes it possible for the coil to be disposed in the middle of the data carrier despite the smaller thickness of carrier substrate 15b vis-a-vis casting 15a, thereby reducing possible deformations on the cover layers of the data carrier through the coil.

Figure 10:
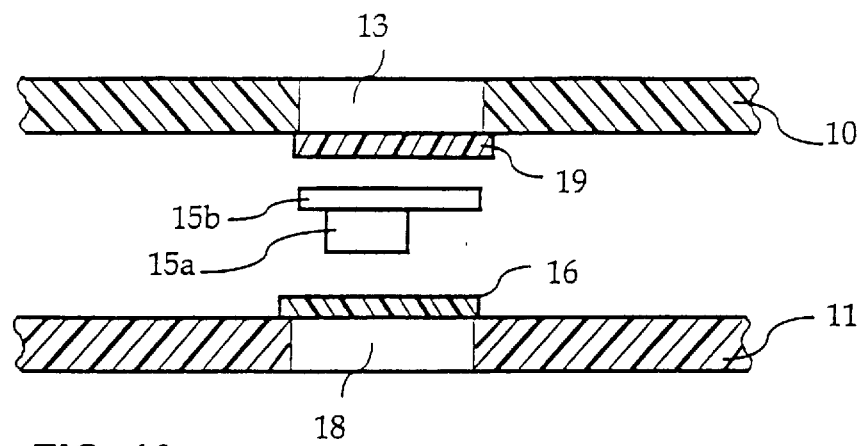
FIG. 10 shows a sectional drawing of a data carrier according to FIG. 4 during application of the filling material on the hole.

FIG. 10 shows a sectional view of a data carrier according to the embodiment of FIG. 4. This figure shows only layers 10 and 11 of interest as well as electronic module 15a and 15b without coil 14. Layer 19 of thermoplastic material is disposed on layer 10 on the side facing electronic module 15a, 15b in the area of hole 13. In the same way layer 16, likewise of thermoplastic material, is disposed on layer 11. The dimensions of layers 16 and 19 are such that they can cover holes 18 and 13, and are thus to be fastened to layers 11 and 10. Layers 16 and 19 preferably consist of an adhesive foil which is prepunched and applied to layers 10 and 11 by heat transfer printing. Alternatively to mounting layers 16 and 19 on the sides of layers 10 and 11 facing electronic module 15a and 15b, one can likewise dispose these layers on the sides facing away from the electronic module.

Figure 11:
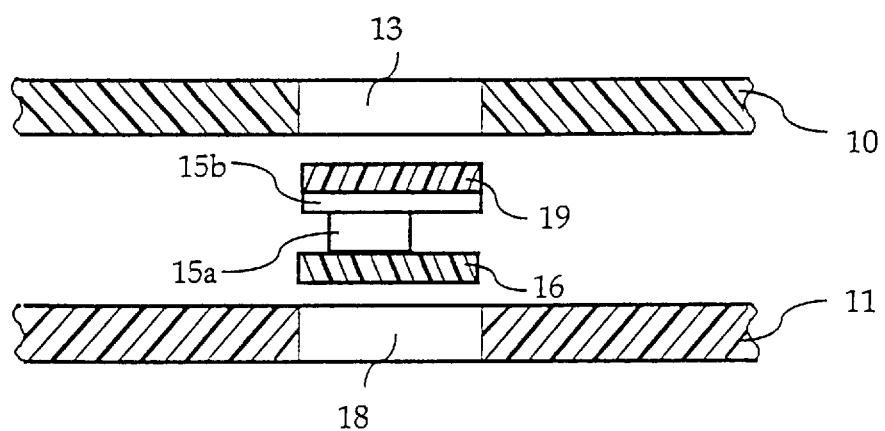
FIG. 11 shows a sectional drawing of a data carrier according to FIG. 4 during application of the filling material on the electronic module.

In the embodiment according to FIG. 11, layers 16 and 19 of thermoplastic material are disposed directly on the top and underside of electronic module 15a, 15b. In this embodiment of the invention it may be advantageous if the dimensions of layers 16 and 19 are not greater than holes 18, 13. This makes it easier to introduce electronic module 15a, 15b into holes 18, 13 in layers 11, 10 during completion.

In the embodiments of FIGS. 10 and 11, layers 16 and 19 of thermoplastic material are preferably designed in the form of an adhesive foil which is covered with separating paper. This adhesive foil can be prepunched and is detached from the separating paper for example with a heatable die and fixed to layers 10 and 11 or to electronic module 15a, 15b.

The method is of course not restricted to production of the data carriers shown. The expert is also called upon to combine and to develop parts of the embodiments.

We claim:

1. A method for producing a multi-layered data carrier carrying an electronic module, comprising the steps of:

providing at least a first and a second layer (4,11,21), the first layer having at least one opening therein (20,18,23), positioning an electronic module (8a,8b,2 or 15a,15b,14) in the opening in the first layer such that there remains a cavity between the module and one side of the opening, printing a filling material (7,16,19) on the second layer selectively in the area of said side of the opening of the first layer including the cavity, the softening temperature of the filling material being lower than the softening temperature of the at least first and second layers, and laminating at least first and second layers and filling material under heat sufficient to soften the at least first and second layers, and pressure such that the filling material is caused to soften and flow at least partly into the cavity remaining between the electronic module and the opening before said at least first and second layers are softened and laminated.

2. The method of claim 1, wherein the filling material is provided on at least a second layer in the area of the opening in the first layer.

3. The method of claim 1, wherein the filling material is provided over the opening in the first layer.

4. The method of claim 1, wherein the filling material is provided on at least one side of the electronic module.

5. The method of claim 1, wherein said electronic module is fixed to one of said layers by at least a dot of fixing material and further wherein at least one further dot of said material is provided to fix the electronic module to one of the layers.

6. The method of claim 5, wherein the electronic module is fixed on one of the layers with at least one applied dot before lamination of the layers on the data carrier.

7. The method of claim 1, wherein the electronic module is fixed on at least one of the layers at least partly by means of ultrasound welding before lamination of the layers of the data carrier.

8. The method of claim 5, wherein the dot is printed on a layer.

9. The method of claim 8, wherein screen printing or heat transfer printing is used to print the filling material.

10. The method of claim 9, wherein screen printing or heat transfer printing is used to print the dot.

11. The method of claim 1, wherein at least one of the layers is pretreated with a plasma to achieve an improvement in adhesive properties.

12. The method of claim 1, wherein at least the electronic module is pretreated with a plasma to achieve an improvement in adhesive properties.

13. The method of claim 1, wherein at least one of the layers and the electronic module is pretreated with a plasma to achieve an improvement in adhesive properties.

14. A method for producing a multi-layered data carrier carrying an electronic module, comprising the steps of:

providing at least a first and second layer (4,11,21) having at least one opening therein (20,18,23), printing a filling material (7,16,19) on at least one surface of an electronic module (150,156), the softening temperature of the filling material being lower than the softening temperature of said at least first and second layers, positioning the electronic module (15a, 15b, 14) in the opening in the first layer such that there remains a cavity between the module and one side of the opening, and laminating at least first and second layers and the filling material under heat sufficient to soften the at least first and second layers, and pressure such that the filling material is caused to soften and flow at least partly into the cavity remaining between the electronic module and the opening before the at least first and second layers are softened and laminated.

* * * * *